(12) United States Patent
Yamaguchi et al.

(10) Patent No.: US 6,710,464 B2
(45) Date of Patent: Mar. 23, 2004

(54) RESIN MOLD SEMICONDUCTOR DEVICE

(75) Inventors: Yasuo Yamaguchi, Hyogo (JP); Makoto Nakanishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/189,586

(22) Filed: Jul. 8, 2002

(65) Prior Publication Data

US 2003/0047815 A1 Mar. 13, 2003

(30) Foreign Application Priority Data

Sep. 10, 2001 (JP) .................................... 2001-273213

(51) Int. Cl.$^7$ .............................................. H01L 23/48
(52) U.S. Cl. ....................... 257/782; 257/785; 257/783
(58) Field of Search ................... 257/782, 785, 257/783

(56) References Cited

U.S. PATENT DOCUMENTS 6,350,630 B1 * 2/2002 Wildgen ...................... 438/51

6,466,046 B1 * 10/2002 Maruyama et al. ......... 324/760

FOREIGN PATENT DOCUMENTS

| JP | 1-80031 | 3/1989 |
|----|---------|--------|
| JP | 2-37729 | 2/1990 |

* cited by examiner

Primary Examiner—Evan Pert
Assistant Examiner—Luan Thai
(74) Attorney, Agent, or Firm—McDermott, Will & Emery

(57) ABSTRACT

A sealing material in a plate form is placed on a frame wherein a recess is provided. A semiconductor chip and the frame are overlapped via the sealing material in a plate form within a thermostatic chamber of which the temperature is higher than the temperature at the time of the sealing of the semiconductor chip and the frame in a resin. After that, the semiconductor chip and the frame, which overlap each other, are taken out of the thermostatic chamber so as to be cooled down in the atmosphere. After that, they are sealed in a molding resin. The semiconductor chip is secured to the frame due to the differential pressure (negative pressure) between the pressure within the airtight space and atmospheric pressure. Thereby, a resin mold semiconductor device is gained wherein a semiconductor chip is secured to a frame without using a die bonding material.

7 Claims, 12 Drawing Sheets

RESIN MOLD SEMICONDUCTOR DEVICE

BACKGROUND OF THE INVENTION

1. Field of the Invention

The present invention relates to a resin mold semiconductor device, in particular, to a resin mold semiconductor device wherein a semiconductor chip and a frame are sealed in a molding resin.

2. Description of the Background Art

A resin mold semiconductor device is formed by securing a semiconductor chip, which is gained by dicing a silicon wafer on which a predetermined circuit pattern is formed, to a frame so that this is sealed in a molding resin.

Concretely, as shown in FIG. 23, first, a die bonding material 102 is applied to a frame 103. Next, a semiconductor chip 101 is mounted on frame 103 so as to be secured to frame 103 by means of die bonding material 102.

After that, semiconductor chip 101 and frame 103 are electrically connected (not shown) by means of wires, or the like, and semiconductor chip 101 and frame 103 are placed within a predetermined metal mold so that a molding resin is made to flow therein. Thus, a resin mold semiconductor device is gained.

However, a conventional resin mold semiconductor device has the following problem points. As described above, die bonding material 102 is used in order to secure semiconductor chip 101 to frame 103. Mainly, Pb—Sn-based solder or an epoxy-based resin is applied as die bonding material 102.

In particular, since Pb is included in the Pb—Sn-based solder, a securing method that does not use lead, that is to say, a securing method that does not use a die bonding material, is required in view of eliminating environmental problems.

SUMMARY OF THE INVENTION

The present invention is based on the above described requirements and a purpose thereof is to provide a resin mold semiconductor device wherein the semiconductor chip is secured to the frame without using a die bonding material.

A resin mold semiconductor device according to the present invention has a semiconductor chip, a frame part for mounting the semiconductor chip and a resin for sealing the semiconductor chip and the frame part. An airtight space of which the pressure is lower than atmospheric pressure is provided between the semiconductor chip and the frame part in order to secure the semiconductor chip to the frame part.

According to this structure, the semiconductor chip is secured to the frame part due to the differential pressure (negative pressure) between atmospheric pressure and the pressure within the airtight space that is created between the semiconductor chip and the frame part. Thereby, the semiconductor chip can be secured to the frame part without using a die bonding material in contrast to the conventional resin mold semiconductor. As a result, a die bonding material becomes unnecessary so that the utilization of lead, or the like, which is the cause of environmental pollution, can be eliminated.

Concretely, it is preferable to provide a sealing member placed between the semiconductor chip and the frame part so that the airtight space is created in a region surrounded by the sealing member.

Thereby, the airtightness of the airtight space can be secured.

In addition, it is preferable for the frame part to have a recess that becomes the airtight space and a frame side mirror surface portion formed in a portion that contacts the semiconductor chip part so as to surround the recess and it is preferable for the semiconductor chip to include a chip side mirror surface portion formed in a portion that contacts the frame side mirror surface portion.

In this case, since the frame side mirror surface portion and the chip side mirror surface portion contact each other so that the airtightness of the recess that becomes the airtight space is secured without using a sealing member and, thereby, the semiconductor chip can be secured to the frame part.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A manufacturing method for a resin mold semiconductor device according to a first embodiment of the present invention and a resin mold semiconductor device gained by this method are described.

Figure 1:
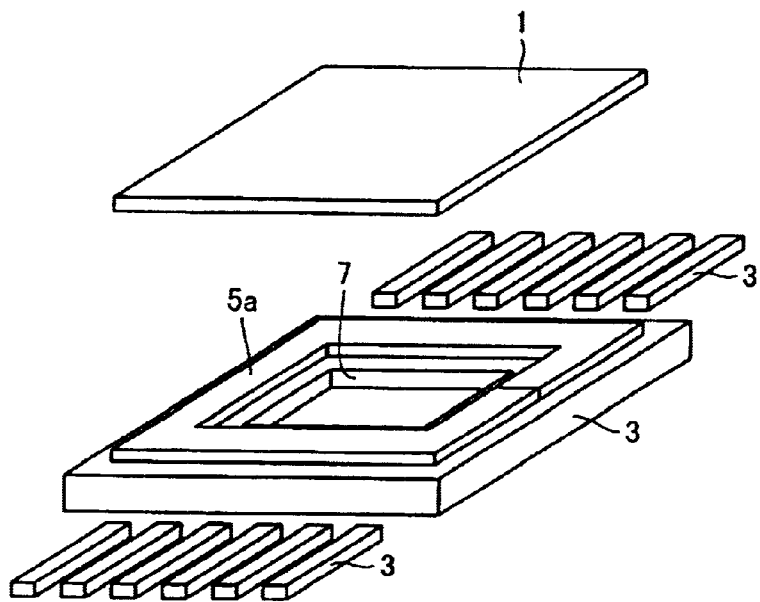
FIG. 1 is a perspective view showing one step of a manufacturing method for a resin mold semiconductor device according to a first embodiment of the present invention.

First, as shown in FIG. 1, a frame 3 wherein a recess 7 is provided in advance is prepared as a frame on which a semiconductor chip 1 is to be mounted. A sealing material 5a in a plate form is mounted on frame 3 so as to surround this recess 7. Here, sealing material 5a in a plate form is cut to the length that can surround the periphery of recess 7 in a sequential manner so as to be placed so that both ends that are cut are overlapped.

Figure 2:
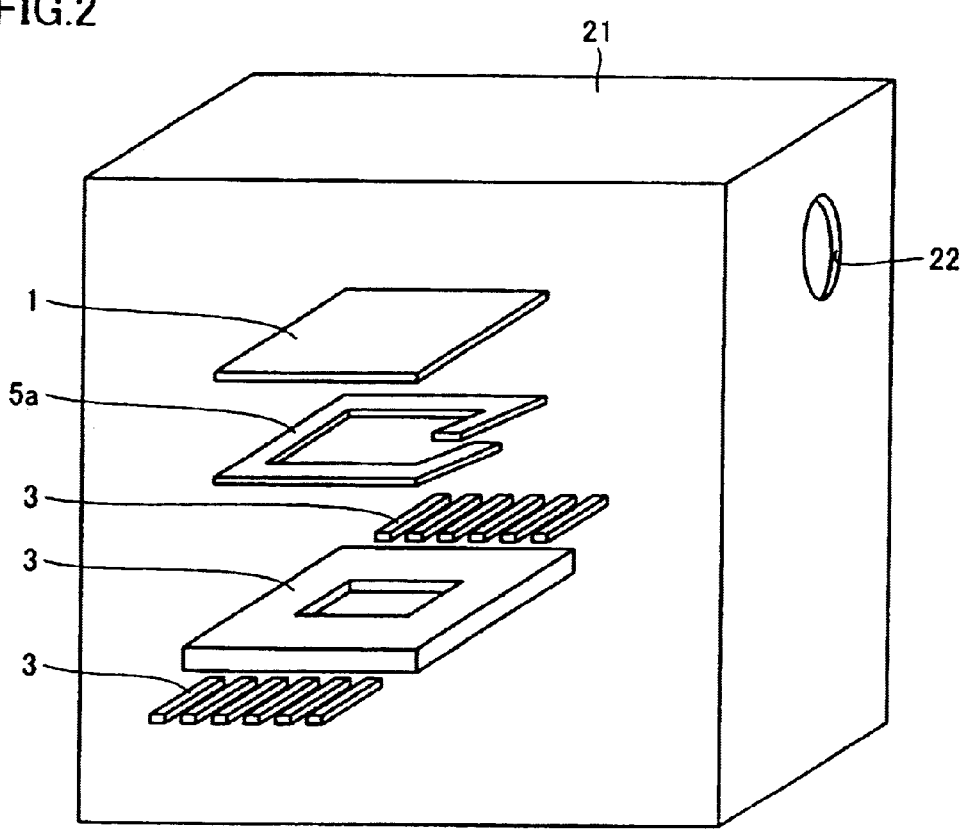
FIG. 2 is a perspective view showing the appearance according to the first embodiment wherein a semiconductor chip and a frame are overlapped within a thermostatic chamber after the step shown in FIG. 1 has been carried out.

Next, as shown in FIG. 2, a thermostatic chamber 21 is prepared. Semiconductor chip 1, sealing material 5a in a plate form and frame 3 are placed within thermostatic chamber 21 at a predetermined temperature wherein semiconductor chip 1 and frame 3 are overlapped via sealing material 5a in a plate form. Here, sealing material 5a in a plate form is preferably formed of indium, resin, or the like.

An aperture 22 that allows communication between the inside and the outside of thermostatic chamber 21 is provided in this thermostatic chamber 21. The temperature within thermostatic chamber 21 is set at a temperature higher than the temperature (for example, approximately 175° C.) at the time when the semiconductor chip and the frame are sealed in a molding resin.

Figure 3:
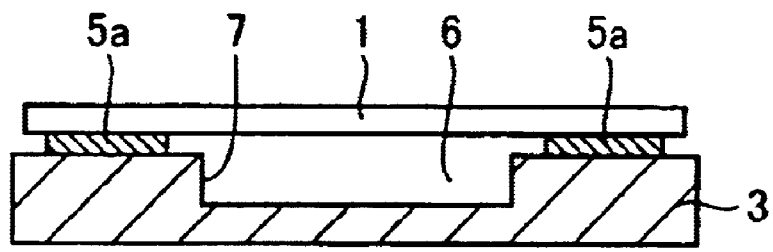
FIG. 3 is a cross sectional view of the semiconductor chip and the frame that have been overlapped in the step shown in FIG. 2 according to the first embodiment.

Accordingly, the overlapping of the semiconductor chip and frame 3 is carried out at a temperature higher than the temperature at the time of resin molding and under atmospheric pressure. Thereby, as shown in FIG. 3, an airtight space 6 that encompasses recess 7 and that is sealed by sealing material 5a in a plate form is created between semiconductor chip 1 and frame 3.

Figure 4:
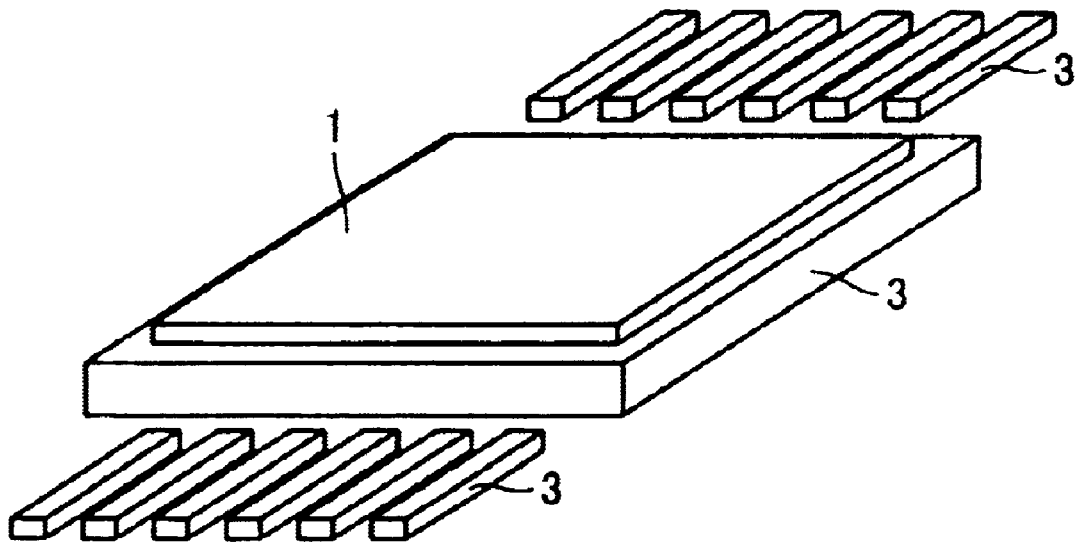
FIG. 4 is a perspective view showing the frame and the semiconductor chip that is secured to the frame that have been taken out of the thermostatic chamber after the step shown in FIG. 2 according to the first embodiment.

After that, semiconductor chip 1 and frame 3, which overlap each other, are taken out of thermostatic chamber 21 and, then, are cooled down under atmospheric pressure. At this time, the volume of airtight space 6 does not substantially change and, in addition, the temperature within airtight space 6 (temperature of the gas that has been sealed in) is lowered to the vicinity of room temperature and, thereby, the pressure within airtight space 6 becomes lower than atmospheric pressure. As a result, as shown in FIG. 4, semiconductor chip 1 is pressed onto frame 3 by means of atmospheric pressure so that semiconductor chip 1 is secured to frame 3.

Next, predetermined electrodes of semiconductor chip 1 and frame 3 are electrically connected through wire bonding. Next, semiconductor chip 1 and frame 3 are placed within a predetermined metal mould (not shown) so that a molding resin is made to flow into this metal mould. The temperature at the time of the filling in of the molding resin is approximately 175° C., as described above.

In addition, airtight space 6 is sealed at a temperature higher than the temperature at the time of the filling in of this molding resin. Therefore, the pressure within airtight space 6 does not become of atmospheric pressure at the time of the filling in of the molding resin so that the pressure can be maintained at a pressure lower than atmospheric pressure. Thereby, semiconductor chip 1 can be prevented from becoming detached from frame 3.

Figure 5:
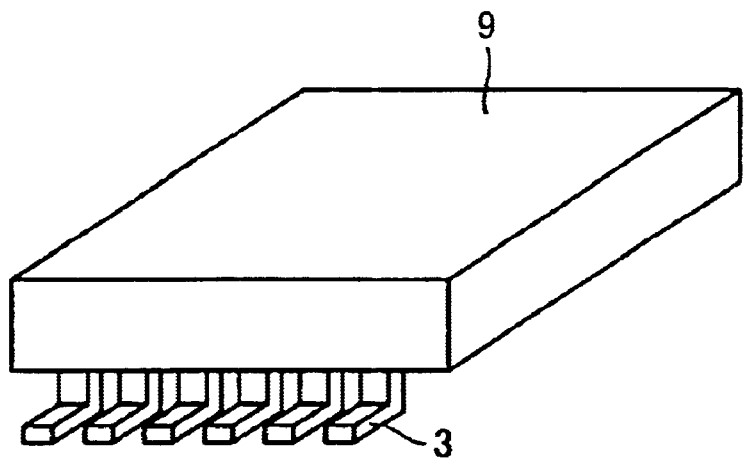
FIG. 5 is a perspective view showing a resin mold semiconductor device that is sealed in a molding resin after the step shown in FIG. 4 according to the first embodiment.
Figure 6:
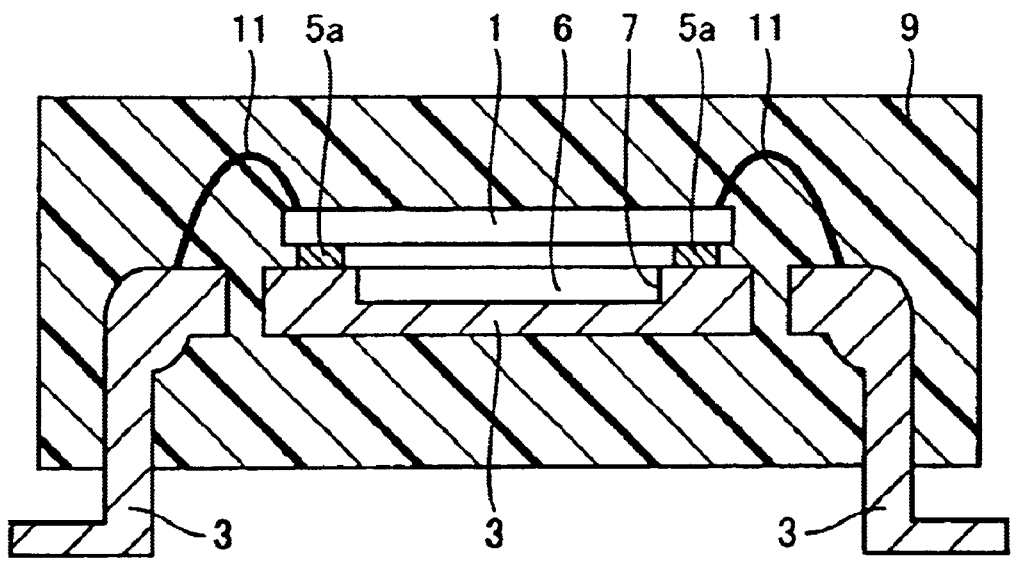
FIG. 6 is a cross sectional view of the resin mold semiconductor device that is shown in FIG. 5 according to the first embodiment.

After that, as shown in FIG. 5, a resin mold semiconductor device that is sealed in molding resin 9 is taken out of the metal mould. In the resin mold semiconductor device, as shown in FIG. 6, semiconductor chip 1 and frame 3 are electrically connected through wires 11 and, in addition, semiconductor chip 1 and frame 3 are sealed in molding resin 9 under the condition where airtight space 6 is created between semiconductor chip 1 and frame 3. Thus, the resin mold semiconductor device is completed.

In the above described resin mold semiconductor device, semiconductor chip 1 is secured to frame 3 by utilizing differential pressure (negative pressure) between atmospheric pressure and the pressure within airtight space 6 that is created between semiconductor chip 1 and frame 3.

Thereby, semiconductor chip 1 can be secured to frame 3 without using die bonding material in contrast to the conventional resin mold semiconductor device. As a result, die bonding material becomes unnecessary so that the utilization of lead, or the like, that becomes the cause of environmental pollution can be eliminated.

Figure 7:
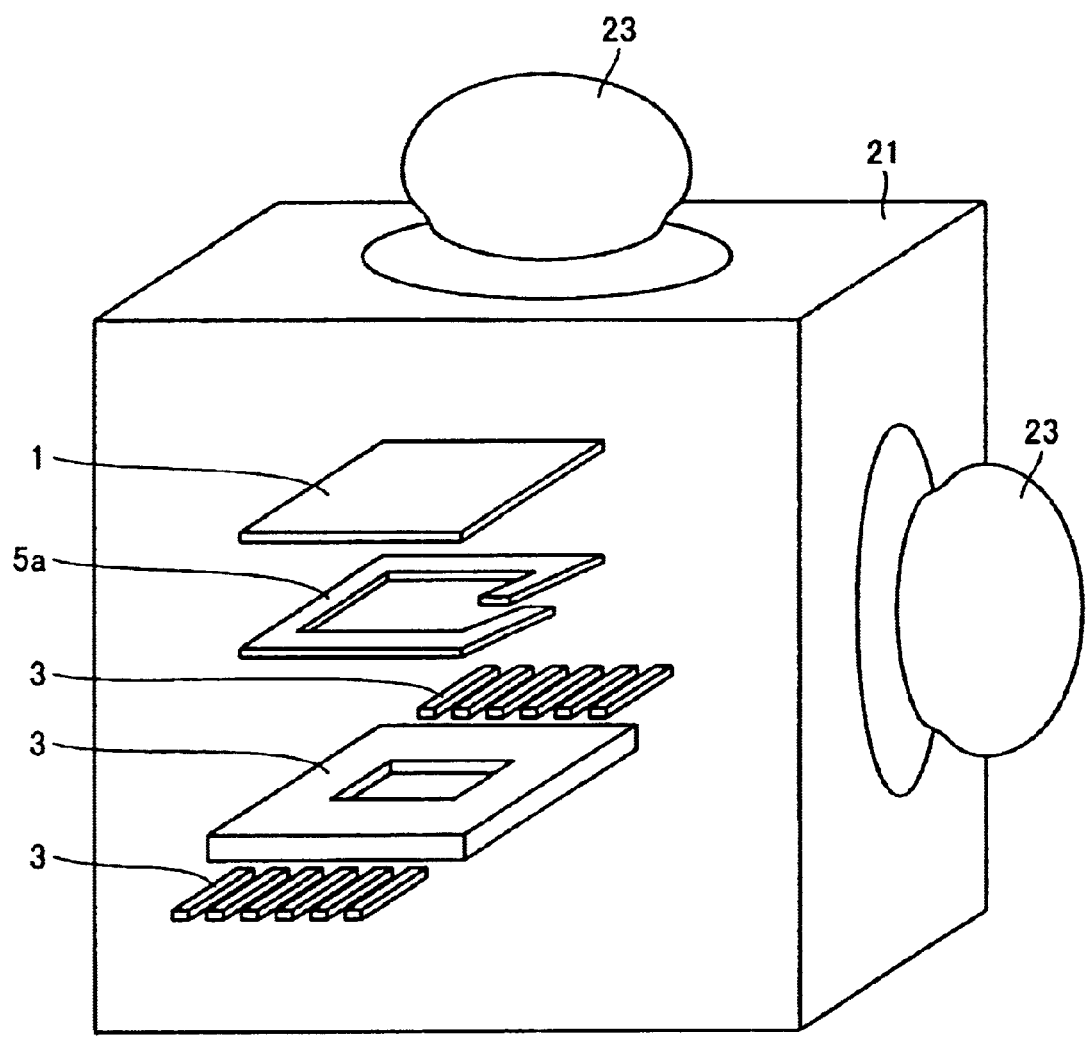
FIG. 7 is a perspective view showing another thermostatic chamber according to the first embodiment.

Here, though in the above described manufacturing method for a resin mold semiconductor device a thermostatic chamber is used wherein aperture 22 is provided in order to maintain the inside of thermostatic chamber 21 at atmospheric pressure, a volume variable portion 23 that allows the volume within thermostatic chamber 21 to change in order to maintain the pressure within thermostatic chamber 21 at atmospheric pressure may be provided as shown in FIG. 7.

More concretely, volume variable portion 23 is preferably formed of rubber, or the like, so as to be able to expand and contract or has a bellows structure formed of rubber, metal, or the like. In addition, volume variable portion 23 may be a pressure valve that maintains the inside of thermostatic chamber 21 at a constant pressure. By using such a thermostatic chamber 21, semiconductor chip 1 can also be secured to frame 3.

Second Embodiment

A manufacturing method for a resin mold semiconductor device according to a second embodiment of the present invention and a resin mold semiconductor device gained by this method are described.

Figure 8:
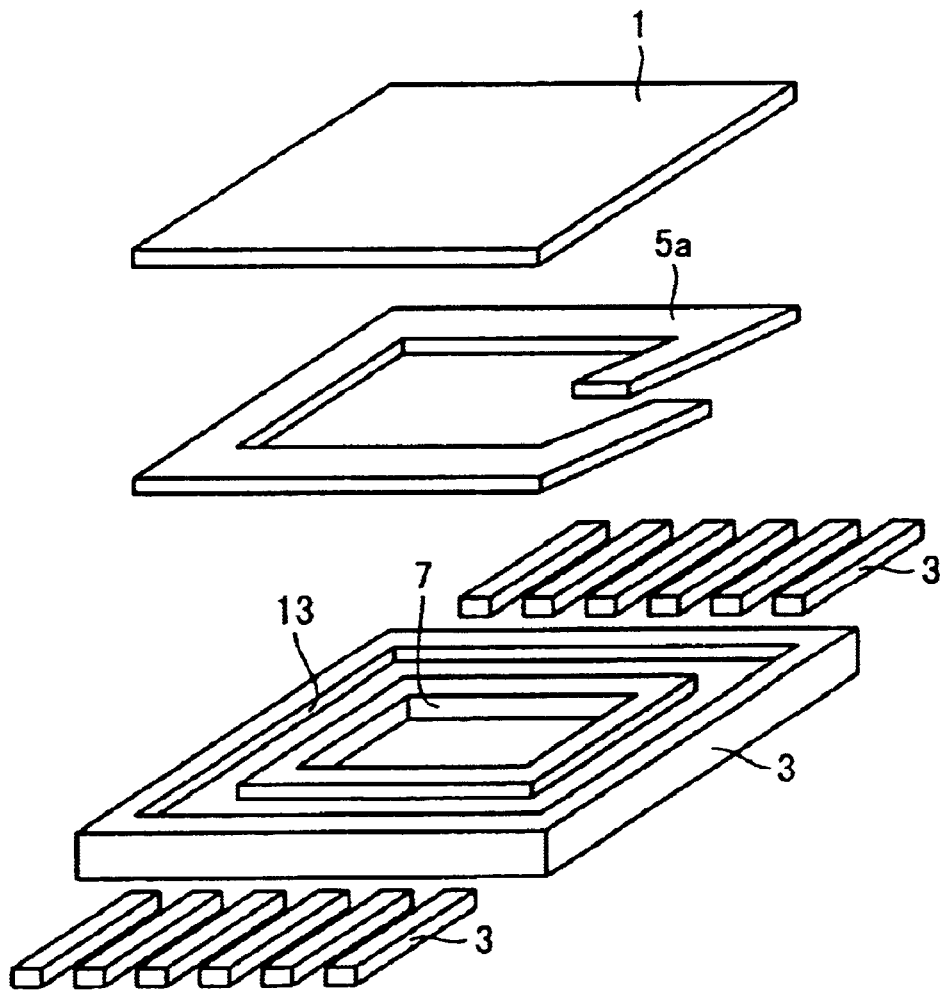
FIG. 8 is a perspective view showing one step of a manufacturing method for a resin mold semiconductor device according to a second embodiment of the present invention.

As shown in FIG. 8, a frame 3 wherein a recess 7 and a receiving trench 13 for receiving a sealing material 5a in a plate form located so as to surround this recess 7 are provided in advance is prepared as a frame on which a semiconductor chip 1 is to be mounted.

Sealing material 5a in a plate form is placed in this receiving trench 13. Here, as described above, sealing material 5a in a plate form is cut into the length that can surround the periphery of recess 7 in a sequential manner so as to be placed so that both ends that are cut are overlapped.

Figure 9:
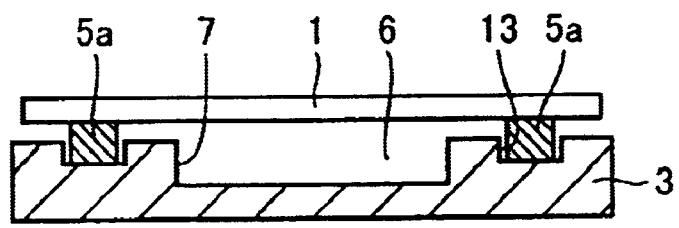
FIG. 9 is a cross sectional view showing the semiconductor chip and the frame that have been overlapped in the step shown in FIG. 8 according to the second embodiment.

Next, in the same manner as in the above described method, semiconductor chip 1, sealing material 5a in a plate form and frame 3 are placed in thermostatic chamber 21 at a predetermined temperature as shown in FIG. 2, wherein semiconductor chip 1 and frame 3 are overlapped via sealing material 5a in a plate form. Thereby, as shown in FIG. 9, an airtight space 6 that encompasses recess 7 and that is sealed by sealing material 5a is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, since receiving trench 13 is created in frame 3 for receiving sealing material 5a in a plate form, sealing material 5a in a plate form is prevented from shifting even in the case that airtight space 6 becomes of negative pressure so that the airtightness of airtight space 6 can be further enhanced.

Third Embodiment

A manufacturing method for a resin mold semiconductor device according to a third embodiment of the present invention and a resin mold semiconductor device gained by this method are described.

Figure 10:
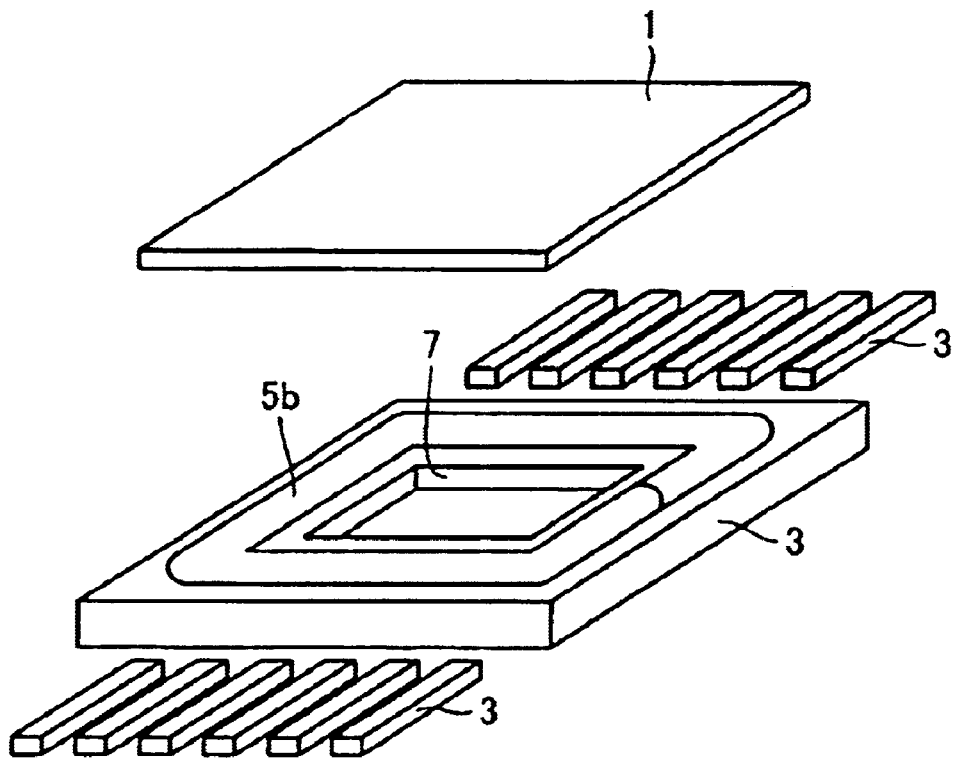
FIG. 10 is a perspective view showing one step of a manufacturing method for a resin mold semiconductor device according to a third embodiment of the present invention.

As shown in FIG. 10, a frame 3 wherein a recess 7 is provided in advance is prepared as a frame on which a semiconductor chip 1 is to be mounted. A sealing material 5b in a line form is placed on frame 3 so as to surround this recess 7. Here, sealing material 5b in a line form is cut into the length that can surround the periphery of recess 7 in a sequential manner so as to be placed so that both ends that are cut are overlapped.

Figure 11:
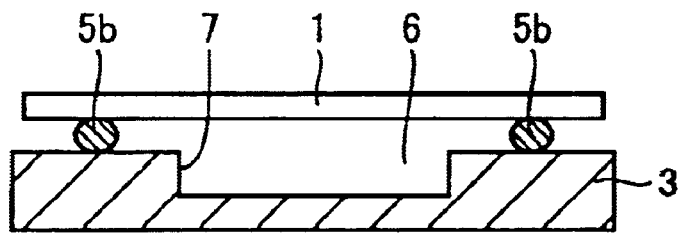
FIG. 11 is a cross sectional view showing the semiconductor chip and the frame that have been overlapped in the step shown in FIG. 10 according to the third embodiment.

Next, in the same manner as in the above described method, semiconductor chip 1, sealing material 5b in a line form and frame 3 are placed in thermostatic chamber 21 at a predetermined temperature as shown in FIG. 2, wherein semiconductor chip 1 and frame 3 are overlapped via sealing material 5b in a line form. Thereby, as shown in FIG. 11, an airtight space 6 that encompasses recess 7 and that is sealed by means of sealing material 5b in a line form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, by using sealing material 5b in a line form as a sealing material for creating airtight space 6, the process thereof becomes easier in comparison with the case wherein sealing material 5a in a plate form is used.

Fourth Embodiment

A manufacturing method for a resin mold semiconductor device according to a fourth embodiment of the present invention and a resin mold semiconductor device gained by this method are described.

Figure 12:
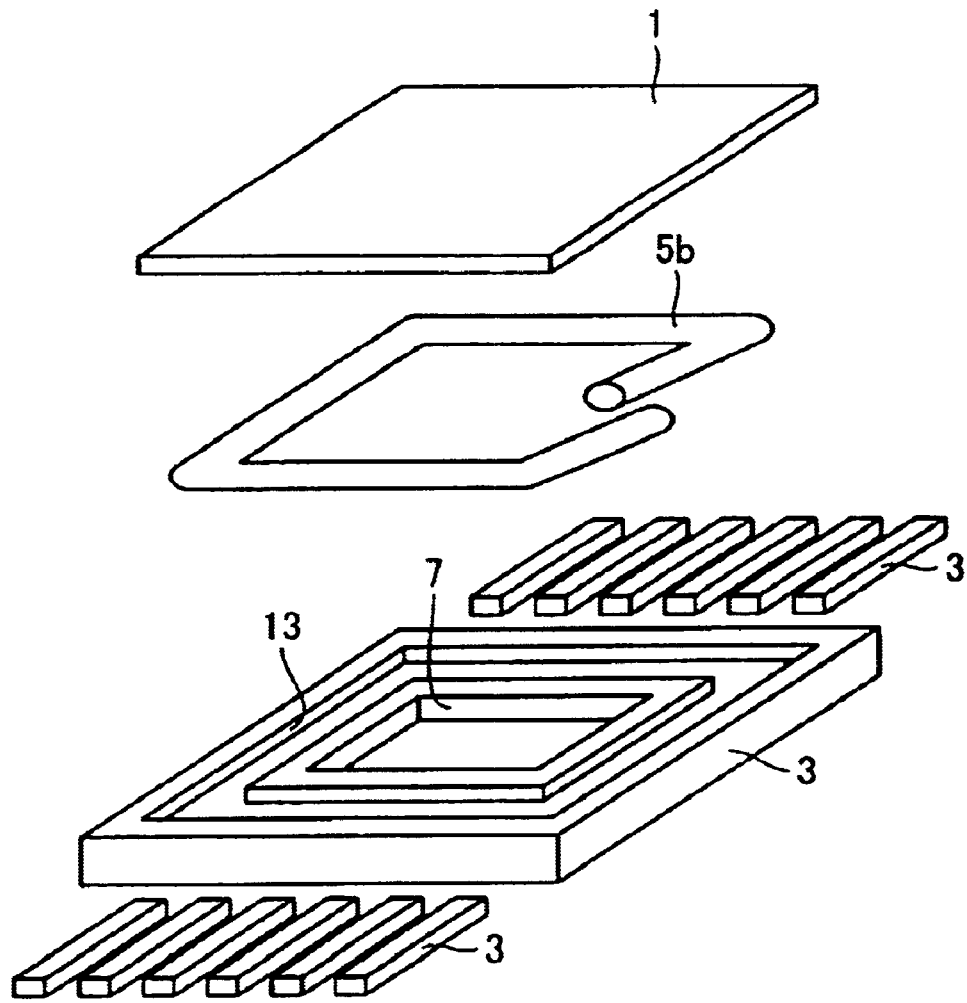
FIG. 12 is a perspective view showing one step of a manufacturing method for a resin mold semiconductor device according to a fourth embodiment of the present invention.

As shown in FIG. 12, a frame 3, wherein a recess 7 and a receiving trench 13 for receiving a sealing material 5b in a line form that is located so as to surround this recess 7 are provided in advance, is prepared as a frame on which a semiconductor chip 1 is to be mounted.

Sealing material 5a in a plate form is placed in this receiving trench 13. Here, sealing material 5b in a line form is cut into the length that can surround the periphery of recess 7 in a sequential manner so as to be placed so that both ends that are cut are overlapped.

Figure 13:
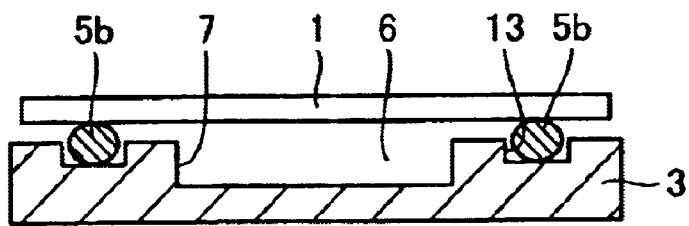
FIG. 13 is a cross sectional view showing the semiconductor chip and the frame that have been overlapped in the step shown in FIG. 12 according to the fourth embodiment.

Next, in the same manner as in the above described method, semiconductor chip 1, sealing material 5b in a line form and frame 3 are placed in thermostatic chamber 21 at a predetermined temperature as shown in FIG. 2, wherein semiconductor chip 1 and frame 3 are overlapped via sealing material 5b in a line form. Thereby, as shown in FIG. 13, an airtight space 6 that encompasses recess 7 and that is sealed by means of sealing material 5b in a line form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, since receiving trench 13 for receiving sealing material 5b in a line form is created in frame 3, sealing material 5b in line form is prevented from shifting even in the case that airtight space 6 becomes of negative pressure so that the airtightness of airtight space 6 can be further enhanced.

Fifth Embodiment

A manufacturing method for a resin mold semiconductor device according to a fifth embodiment of the present invention and a resin mold semiconductor device gained by this method are described.

Figure 14:
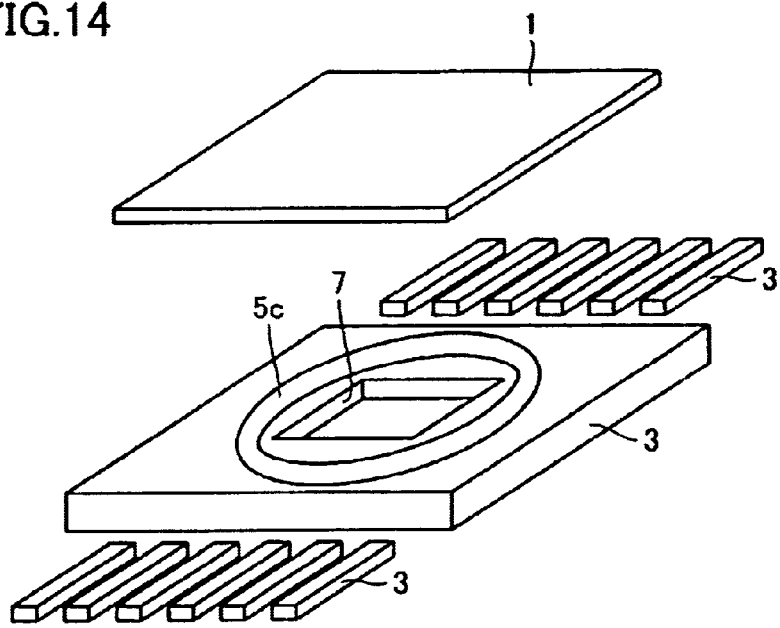
FIG. 14 is a perspective view showing one step of a manufacturing method for a resin mold semiconductor device according to a fifth embodiment of the present invention.

As shown in FIG. 14, a frame 3 wherein a recess 7 is provided in advance is prepared as a frame on which a semiconductor chip 1 is to be mounted. A sealing material 5c in a ring form, which is in an approximately circular form, is placed on frame 3 so as to surround this recess 7.

Next, in the same manner as in the above described method, semiconductor chip 1, sealing material 5c in a ring form and frame 3 are placed in thermostatic chamber 21 at a predetermined temperature shown in FIG. 2, wherein semiconductor chip 1 and frame 3 are then overlapped via sealing material 5c in a ring form. Thereby, in the same manner as shown in FIG. 3 or FIG. 11, an airtight space 6 that encompasses recess 7 and that is sealed by means of sealing material 5c in a ring form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, by using sealing material 5c in a ring form, which is in an approximately circular form, as a sealing material for creating airtight space 6, positioning (alignment) at the time of mounting sealing material 5c in a ring form on frame 3 becomes easy in comparison with the case wherein the above described sealing material 5a in a plate form or sealing material 5b in a line form that is arranged in a rectangular form as described above is used.

Sixth Embodiment

A manufacturing method for a resin mold semiconductor device according to a sixth embodiment of the present invention and a resin mold semiconductor device gained by this method are described.

Figure 15:
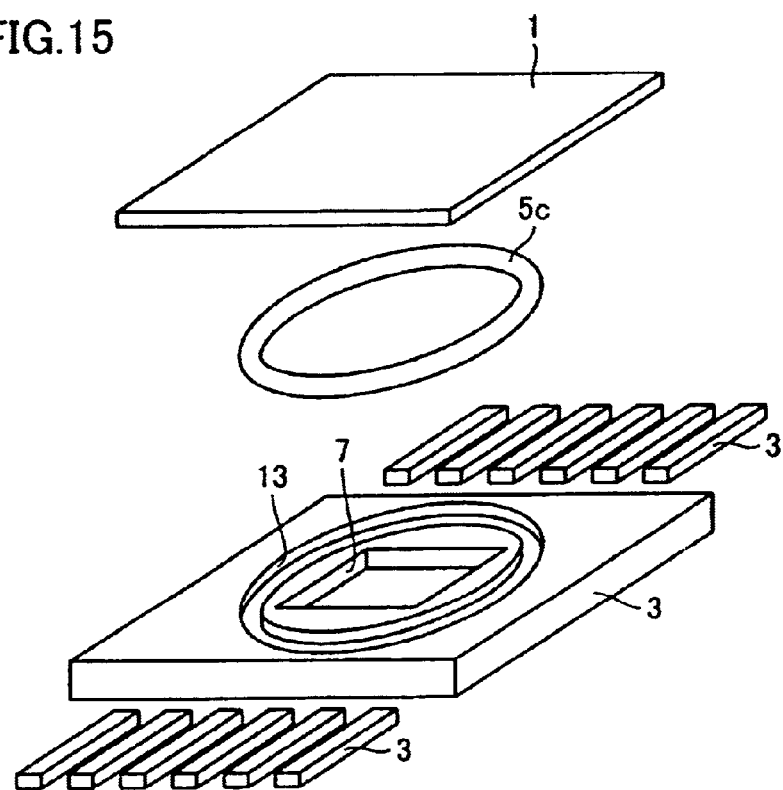
FIG. 15 is a perspective view showing one step of a manufacturing method for a resin mold semiconductor device according to a sixth embodiment of the present invention.

As shown in FIG. 15, a frame 3 wherein a recess 7 and a receiving trench 13 for receiving a sealing material 5c in a ring form, which is in an approximately circular form, that is located so as to surround this recess 7 are provided in advance is prepared as a frame on which a semiconductor chip 1 is to be mounted. Sealing material 5c in a ring form is placed in this receiving trench 13.

Next, in the same manner as in the above described method, semiconductor chip 1, sealing material 5c in a ring form and frame 3 are placed in thermostatic chamber 21 at a predetermined temperature shown in FIG. 2, wherein semiconductor chip 1 and frame 3 are then overlapped via sealing material 5c in a ring form. Thereby, in the same manner as shown in FIG. 9 or FIG. 13, an airtight space 6 that encompasses recess 7 and that is sealed by means of sealing material 5c in a ring form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, since receiving trench 13 for receiving sealing material 5c in a ring form is created in frame 3, sealing material 5c in ring form is prevented from shifting even in the case that airtight space 6 becomes of negative pressure so that the airtightness of airtight space 6 can be further enhanced.

Seventh Embodiment

A manufacturing method for a resin mold semiconductor device according to a seventh embodiment of the present invention and a resin mold semiconductor device gained by this method are described.

Figure 16:
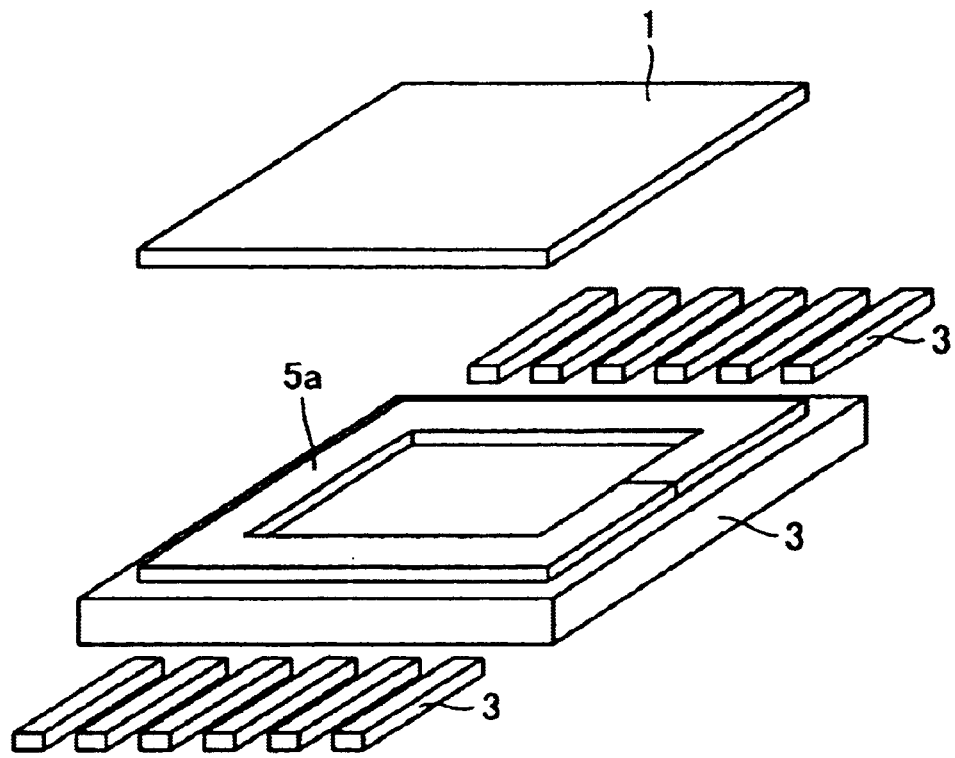
FIG. 16 is a perspective view showing one step of a manufacturing method for a resin mold semiconductor device according to a seventh embodiment of the present invention.

As shown in FIG. 16, a sealing material 5a in a plate form is placed so as to surround a predetermined region of a frame 3 on which a semiconductor chip 1 is to be mounted. Here, sealing material 5a in a plate form is cut into the length that can surround this predetermined region in a sequential manner so as to be placed so that both ends that are cut are overlapped. In addition, sealing material 5a in a plate form has the thickness that can create an airtight space 6 that allows semiconductor chip 1 to be secured to frame 3 at the time when semiconductor chip 1 and frame 3 are overlapped.

Figure 17:
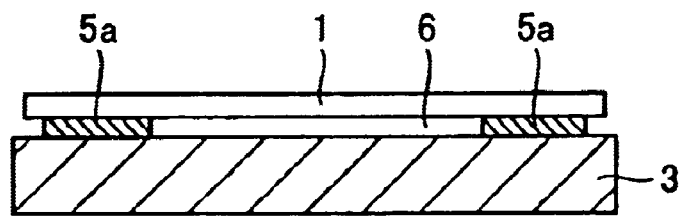
FIG. 17 is a cross sectional view showing the semiconductor chip and the frame that have been overlapped in the step shown in FIG. 16 according to the seventh embodiment.

Next, in the same manner as in the above described method, semiconductor chip 1, sealing material 5a in a plate form and frame 3 are placed in thermostatic chamber 21 at a predetermined temperature shown in FIG. 2, wherein semiconductor chip 1 and frame 3 are then overlapped via sealing material 5a in a plate form. Thereby, as shown in FIG. 17, an airtight space 6 is created between semiconductor chip 1 and frame 3 with a gap corresponding to the thickness of sealing material 5a in a plate form.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, airtight space 6 is created due to a gap corresponding to the thickness of sealing material 5a in a plate form that is placed between semiconductor chip 1 and frame 3. Thereby, it becomes unnecessary to prepare a frame wherein a recess is provided in advance so that a conventional frame can be applied.

Eighth Embodiment

A manufacturing method for a resin mold semiconductor device according to an eighth embodiment of the present invention and a resin mold semiconductor device gained by this method are described.

Figure 18:
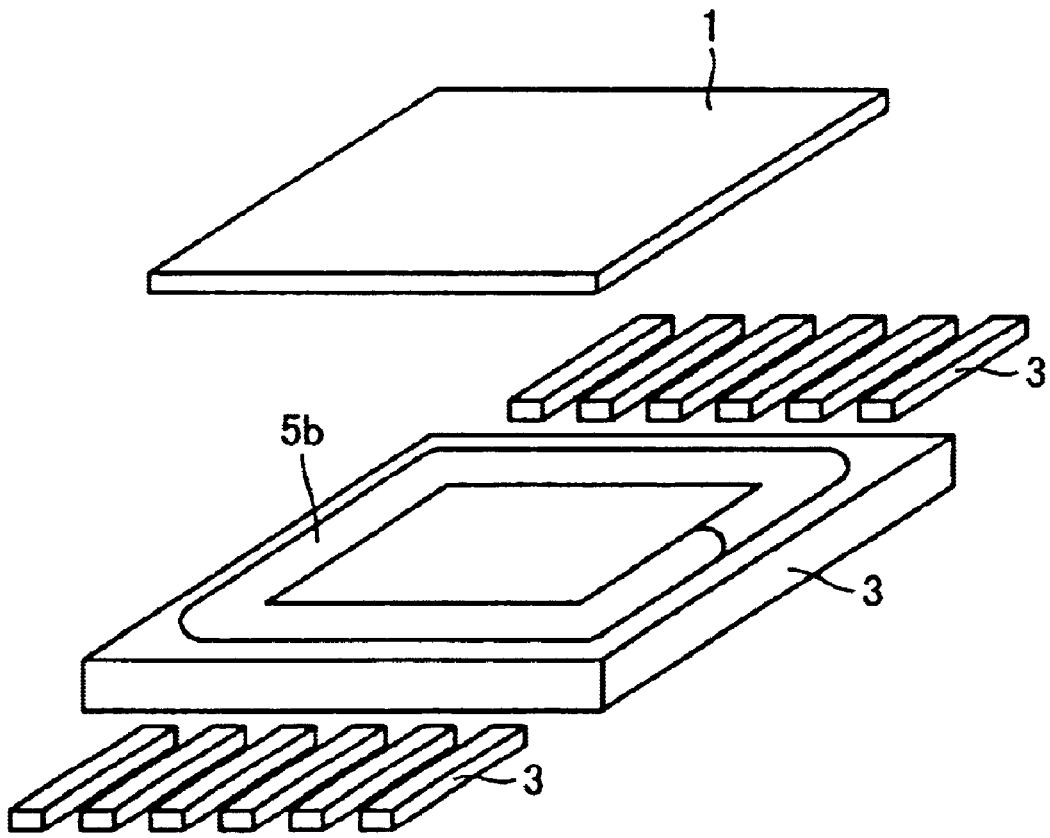
FIG. 18 is a perspective view showing one step of a manufacturing method for a resin mold semiconductor device according to an eighth embodiment of the present invention.

As shown in FIG. 18, a sealing material 5b in a line form is placed so as to surround a predetermined region of a frame 3 on which a semiconductor chip 1 is to be mounted. Here, sealing material 5b in a line form is cut into the length that can surround this predetermined region in a sequential manner so as to be placed so that both ends that are cut are overlapped. In addition, sealing material 5b in a line form has the thickness (diameter) that can create an airtight space 6 that allows semiconductor chip 1 to be secured to frame 3 at the time when semiconductor chip 1 and frame 3 are overlapped.

Figure 19:
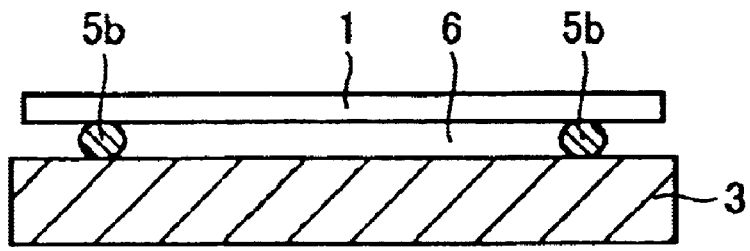
FIG. 19 is a cross sectional view showing the semiconductor chip and the frame that have been overlapped in the step shown in FIG. 18 according to the eighth embodiment.

Next, in the same manner as in the above described method, semiconductor chip 1, sealing material 5b in a line form and frame 3 are placed in thermostatic chamber 21 at a predetermined temperature shown in FIG. 2, wherein semiconductor chip 1 and frame 3 are then overlapped via sealing material 5b in a line form. Thereby, as shown in FIG. 19, an airtight space 6 due to a gap corresponding to the thickness of sealing material 5b in a line form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, it becomes unnecessary to prepare a frame wherein a recess is provided in advance and the process becomes easy due to the use of sealing material 5b in a line form, in comparison with the case wherein sealing material 5a in a plate form is used.

Ninth Embodiment

A manufacturing method for a resin mold semiconductor device according to a ninth embodiment of the present invention and a resin mold semiconductor device gained by this method are described.

Figure 20:
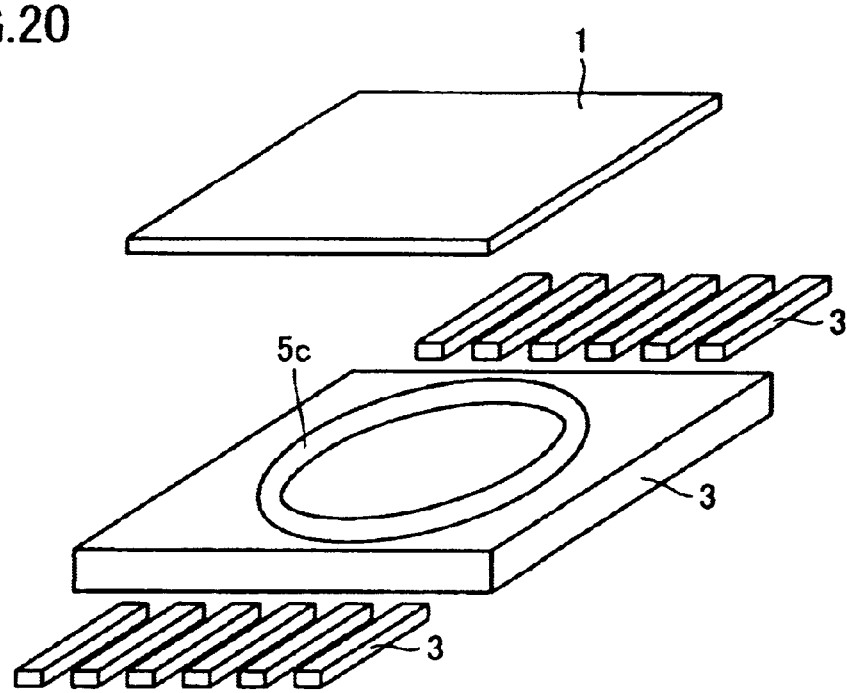
FIG. 20 is a perspective view showing one step of a manufacturing method for a resin mold semiconductor device according to a ninth embodiment of the present invention.

As shown in FIG. 20, a sealing material 5c in a ring form, which is in an approximately circular form, is placed so as to surround a predetermined region of a frame 3 on which a semiconductor chip 1 is mounted. Here, sealing material 5c in a ring form has the thickness (diameter) that can create an airtight space 6 so that semiconductor chip 1 may be secured to frame 3 at the time when semiconductor chip 1 and frame 3 are overlapped.

Next, in the same manner as in the above described method, semiconductor chip 1, sealing material 5c in a ring form and frame 3 are placed in thermostatic chamber 21 at a predetermined temperature shown in FIG. 2, wherein semiconductor chip 1 and frame 3 are overlapped via sealing material 5c in a ring form. Thereby, in the same manner as shown in FIG. 17 or FIG. 19, an airtight space 6 due to a gap corresponding to the thickness of sealing material 5b in a ring form is created between semiconductor chip 1 and frame 3.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, it becomes unnecessary to prepare a frame wherein a recess is provided in advance and, in addition, alignment becomes easy at the time when sealing material 5c in a ring form is mounted on frame 3 by using sealing material 5c in a ring form, which is in an approximately circular form, as a sealing material, in comparison with the case wherein sealing material 5a in a plate form or sealing material 5b in a line form that is arranged in the above described rectangular form is used.

Tenth Embodiment

A manufacturing method for a resin mold semiconductor device according to a tenth embodiment of the present invention and a resin mold semiconductor device gained by this method are described.

Figure 21:
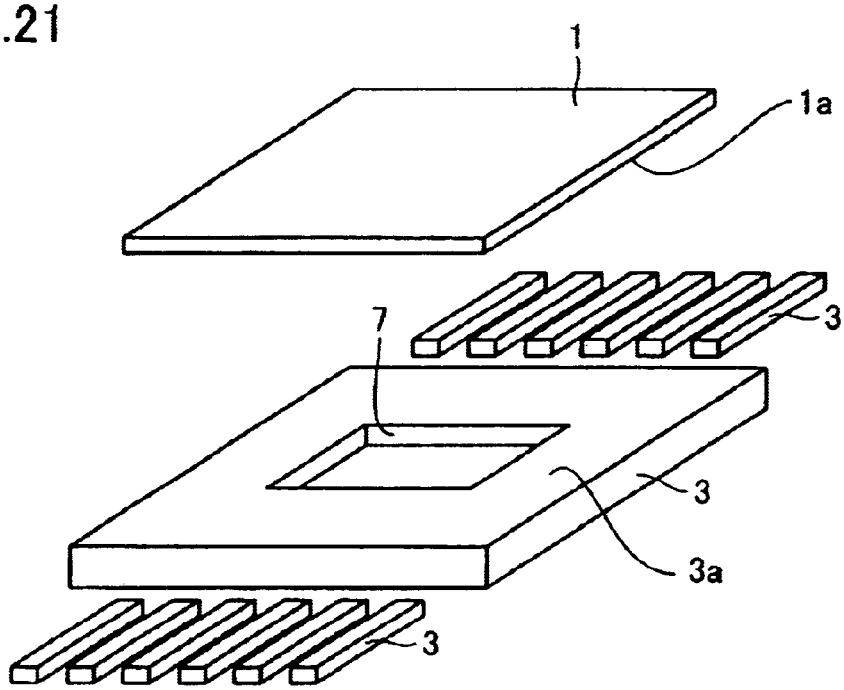
FIG. 21 is a perspective view showing one step of a manufacturing method for a resin mold semiconductor device according to a tenth embodiment of the present invention.

As shown in FIG. 21, a frame 3 wherein a recess 7 is provided in advance is prepared as a frame on which a semiconductor chip 1 is mounted. In addition, a mirror surface 3a is formed by carrying out mirror surface polishing in a portion of frame 3 that is to contact semiconductor chip 1 and that surrounds the periphery of the above recess 7. On the other hand, a mirror surface 1a is also formed by carrying out mirror surface polishing in a portion of semiconductor chip 1 that is to contact mirror surface 3a of frame 3.

Figure 22:
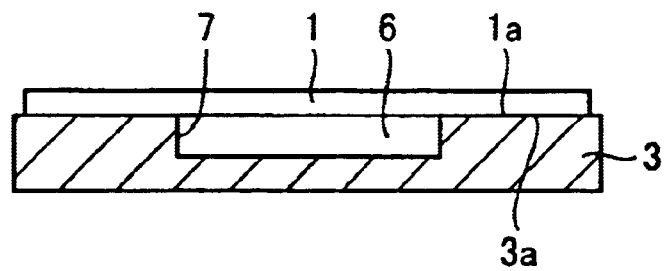
FIG. 22 is a cross sectional view showing the semiconductor chip and the frame that have been overlapped in the step shown in FIG. 21 according to the tenth embodiment.
Figure 23:
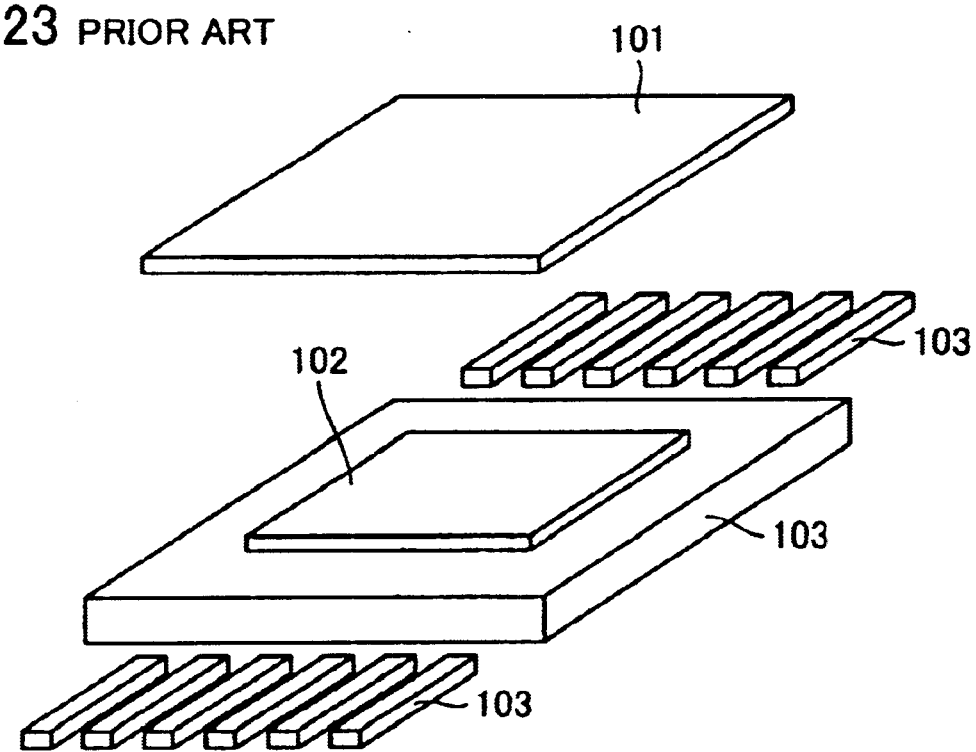
FIG. 23 is a perspective view showing one step of a manufacturing method for a resin mold semiconductor device according to a prior art.

Next, in the same manner as in the above described method, semiconductor chip 1 and frame 3 are placed in thermostatic chamber 21 at a predetermined temperature shown in FIG. 2, wherein semiconductor chip 1 and frame 3 are overlapped. Thereby, as shown in FIG. 22, an airtight space 6 that encompasses recess 7 and that is sealed is created between semiconductor chip 1 and frame 3 by making a contact between mirror surfaces 1a and 3a.

After that, in the same manner as in the above described method, semiconductor chip 1 and frame 3, which overlap each other, are taken out of thermostatic chamber 21 and, then, are cooled down under atmospheric pressure. Next, the predetermined electrodes of semiconductor chip 1 and frame 3 are electrically connected through wire bonding. Next, semiconductor chip 1 and frame 3 are placed within a predetermined metal mold and a molding resin is made to flow into this metal mold. After that, a resin mold semiconductor device that is sealed in the molding resin is taken out of the metal mold. The resin mold semiconductor device is thus completed.

In the above described resin mold semiconductor device, in addition to the effect that semiconductor chip 1 can be secured to frame 3 without using the above described die bonding material, the following effect is gained.

That is to say, airtight space 6 can be formed without using a sealing material by allowing the respective mirror surfaces of semiconductor chip 1 and frame 3 to contact each other.

In addition, as an example of a semiconductor package, the above first to tenth embodiments are described by citing a DIP (dual inline package). The present invention is not limited to this but, rather, the invention can be applied to a type of a semiconductor device wherein a semiconductor chip is secured to a substrate such as an island portion. The invention can be applied, for example, to a semiconductor device that has an inline-type package or an insertion mounting-type package, such as a PGA (pin grid array package), in addition to the inline-type package. Moreover, the invention can also be applied to a semiconductor device that has a surface mounting-type package such as a flat packing type like a QFP (quad flat package) or a chip carrier type like a BGA (ball grid array).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin mold semiconductor device comprising:

a semiconductor chip;

a frame part for mounting said semiconductor chip; and a resin for sealing said semiconductor chip and said frame part, wherein an airtight space of which the pressure is lower than atmospheric pressure so as to secure said semiconductor chip to said frame part is provided between said semiconductor chip and said frame part, said airtight space completely enclosed by said semiconductor chip and said frame part.

2. The resin mold semiconductor device according to claim 1, further comprising a sealing member that is placed between said semiconductor chip and said frame part, wherein said airtight space is created in a region surrounded by said sealing member.

3. The resin mold semiconductor device according to claim 2, wherein said frame part encompasses a recess created in a portion surrounded by said sealing member.

4. The resin mold semiconductor device according to claim 3, wherein said frame part includes a receiving trench for receiving said sealing member.

5. The resin mold semiconductor device according to claim 2, wherein said sealing member includes a sealing material in a plate form or a sealing material in a line form formed in an annular form.

6. The resin mold semiconductor device according to claim 2, wherein said sealing member includes a sealing material in a ring form.

7. The resin mold semiconductor device according to claim 1, wherein said frame part includes:

a recess that becomes said airtight space; and a frame side mirror surface portion formed in a portion that contacts said semiconductor chip part, and wherein said semiconductor chip includes a chip side mirror surface portion formed in a portion that contacts said frame side mirror surface portion.

\* \* \* \* \*